United States Patent
Ornes et al.

(10) Patent No.: US 7,734,977 B2
(45) Date of Patent: *Jun. 8, 2010

(54) METHOD AND SYSTEM FOR ERROR CORRECTION OVER SERIAL LINK

(75) Inventors: Matthew D. Ornes, Madison, WI (US); Christopher I. W. Norrie, San Jose, CA (US); Gene K. Chui, Campbell, CA (US)

(73) Assignee: Integrated Device Technology, inc., San Jose, CA (US)

( * ) Notice: Subject to any disclaimer, the term of this patent is extended or adjusted under 35 U.S.C. 154(b) by 1245 days.

This patent is subject to a terminal disclaimer.

(21) Appl. No.: 10/835,711

(22) Filed: Apr. 29, 2004

(65) Prior Publication Data

US 2004/0210815 A1 Oct. 21, 2004

Related U.S. Application Data

(63) Continuation of application No. 09/846,875, filed on May 1, 2001, now Pat. No. 6,748,567.

(51) Int. Cl.
*H04L 1/00* (2006.01)
(52) U.S. Cl. .................. 714/746; 714/752; 714/785
(58) Field of Classification Search .................. 341/59, 341/95; 398/9, 25, 27; 714/752, 785, 746
See application file for complete search history.

(56) References Cited

U.S. PATENT DOCUMENTS

| | | | | | |
|---|---|---|---|---|---|
| 5,144,304 | A | * | 9/1992 | McMahon et al. | 341/58 |
| 5,321,703 | A | * | 6/1994 | Weng | 714/797 |
| 5,450,421 | A | * | 9/1995 | Joo et al. | 714/756 |
| 5,740,186 | A | * | 4/1998 | Widmer | 714/753 |
| 6,662,332 | B1 | * | 12/2003 | Kimmitt | 714/762 |

OTHER PUBLICATIONS

Glossary of Networking Terms for Visio IT Professionals; Published: Nov. 1, 2002; Microsoft Corporation; URL: http://www.microsoft.com/technet/prodtechnol/visio/visio2002/plan/glossary.mspx#E2TAE.*
WordReference.com English Dictionary; Copyright 2003 by Princeton University; URL: http://www.wordreference.com/definition/physical.*
Merriam-Webster Online Dictionary; © 2006 Merriam-Webster, Incorporated; URL: http://www.merriam-webster.com/dictionary/manufacturing.*

* cited by examiner

*Primary Examiner*—Sam Rizk
(74) *Attorney, Agent, or Firm*—Tracy Parris

(57) ABSTRACT

A system and method in accordance with the invention produces an ECC code that is transmitted in the y-bit domain along with data is converted from a native x-bit domain to the y-bit domain. Such a system and method provides a representation of an ECC code that is part of a transmitted serial stream that allows clock recovery and that can use parity checking or other method to verity the integrity of the transmitted ECC code itself.

14 Claims, 6 Drawing Sheets

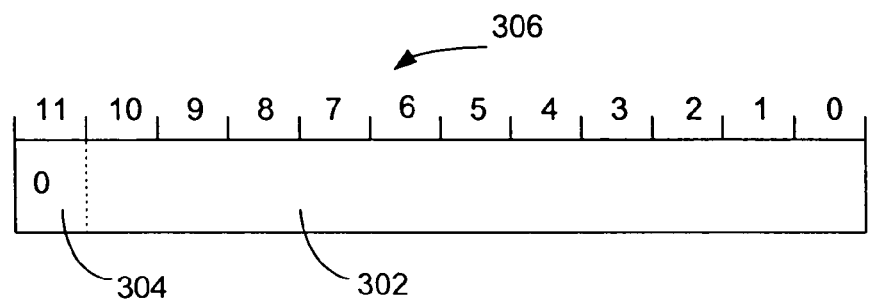
Fig. 3
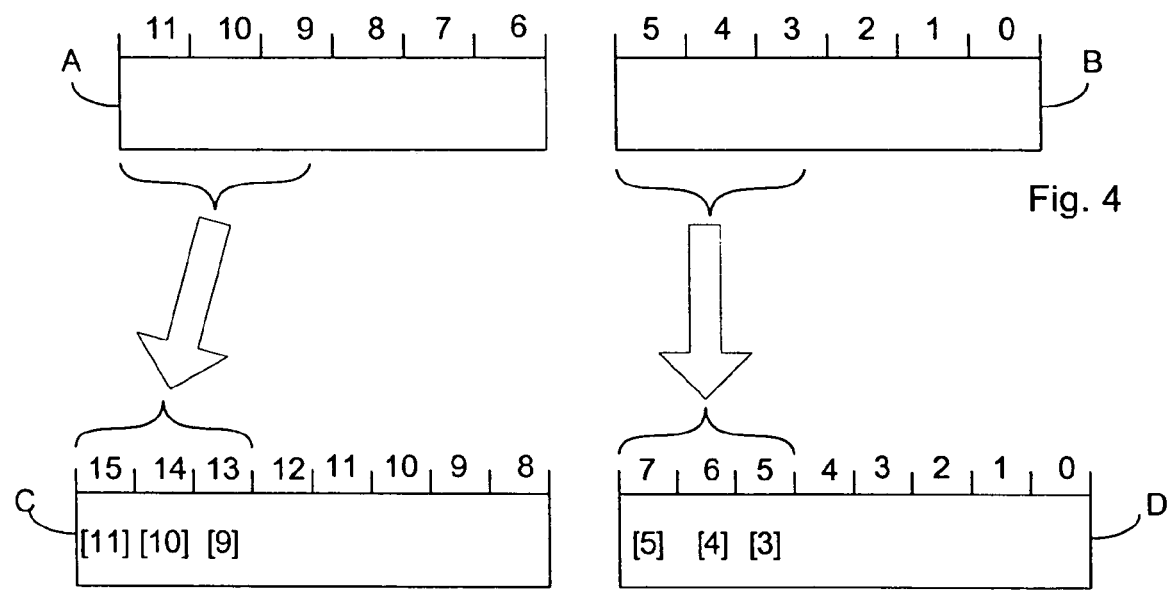
Fig. 4
Fig. 5

METHOD AND SYSTEM FOR ERROR CORRECTION OVER SERIAL LINK

REFERENCE TO PRIOR APPLICATIONS

The present application is a continuation of U.S. application Ser. No. 09/846,875 Ornes et al. (filed May 1, 2001) now U.S. Pat. No 6,748,567. The disclosure of parent application Ser. No. 09/846,875 (filed May 1, 2001) is incorporated herein by reference.

FIELD OF INVENTION

The present invention relates to error checking and correction (ECC) codes, and particularly to the use of ECC codes in DC-balanced, asynchronous communication, such as communication over optical fiber.

BACKGROUND

To save on the number of wires or optical fibers, telecommunications signals are typically transmitted serially and asynchronously. Frequently these signals will be sent between devices such as integrated circuits or circuit boards, so that generally fewer I/O pins and connectors (such as backplane connectors or cable connectors) will be used. Unfortunately, I/O pins and connectors are typically some of the most likely parts of a system to cause single-bit errors in the signals being communicated.

Error checking and correction codes (ECC codes) are often used in a system on data that has a higher than desired chance of becoming corrupted. The ability for an ECC code to detect and correct bit failures depends upon the ECC code utilized. Some ECC codes are designed to detect and correct a burst of errors (several closely spaced errors). Other ECC codes may only repair a single-bit error and detect (but not repair) when two or more bits have failed. Some ECC codes may not be able to detect multiple bit failures. But with any ECC code, when a failure is detected, the ECC code is usually used to generate a "syndrome." The value of the syndrome is generally used to detect and correct bits that have changed state since the ECC code was originally generated at the transmitting entity.

Moreover, once data is transmitted over an asynchronous, serial link, in order for the receiving entity to recover the data communicated with reasonable accuracy, the receiving entity generally needs to identify the rate at which the data was transmitted by the transmitting entity. In other words, the receiving entity needs to recover the clock used by the transmitting entity. In order to recover the clock the receiving entity generally needs to see a certain rate of change between ones and zeros because the transition from one to zero or zero to one is a reliable indicator of a clock edge. If there are too few transitions from one to zero or zero to one, a clock may not be accurately recovered. Further, a significant imbalance between the number of 0's and the number of 1's in the encoded data stream can cause severe loss of waveform integrity on AC coupled links, since any DC content cannot be transmitted and this information is simply lost at the receiver. To some extent, this loss can be accommodated by providing a higher bandwidth transmission medium or by using special compensation techniques at the receiver. However, it is much better to employ codes that are free of any net DC component, so as to gain the advantages of lower error rates. Accordingly, the transmitted signal should be "DC balanced," having approximately the same number of ones and zeros.

When optically communicating over fiber, 8-bit characters (sometimes each character is referred to as a "byte") are frequently converted to 10-bit characters before the data is sent over the optical connection. This conversion is sometimes referred to herein as "8b10b conversion." Still, these 10-bit characters should be DC balanced as well. There are well-known methods and tables for performing 8b10b conversion in a manner that strives for DC balance, such as that described in Franaszek et al., U.S. Pat. No. 4,486,739, issued Dec. 4, 1984, and by Stevens, U.S. Pat. No. 5,025,256, issued Jun. 18, 1991. Although many of the 10-bit characters may not each be perfectly DC balanced, over time such balance can be accomplished by monitoring the running disparity between ones and zeros. If there are more ones, the disparity is positive. If there are more zeros, the disparity is negative. And if there are approximately an equal number of ones and zeros, the disparity is neutral. For example, 1110110011 results in a positive running disparity (more ones than zeros), so the next 10-bit character will generally be selected to have a negative or neutral disparity. Not only is neutral disparity accomplished over time, but every character has enough transitions to recover a clock. Basically, these qualities can be achieved in part by each 8-bit character having either two 10-bit representations (one with a positive disparity and one with a negative disparity) or one 10-bit representation with neutral disparity. The 10-bit representation selected at a particular moment is a function of the current state of the overall monitored running disparity of the transmitted stream. Thus the 10-bit characters are selected in such a manner as to maintain the transmitted disparity within certain limits.

Data is generally transmitted in "packets" or "cells." A given ECC code is typically computed to cover the particular cell it is associated with and is usually transmitted with the cell it covers. However, using the ECC code in the 10-bit domain is not easily done.

If the ECC code is designed to detect and repair a single-bit error in a cell, but the ECC code is generated in the 8-bit domain (undergoing 8b 10b conversion with the rest of the cell), then when a 1-bit error occurs in transit, the failing bit will result in an erroneous 10-bit character. This erroneous 10-bit character will then be converted to an erroneous 8-bit character, which may differ from the original 8-bit character by more then one bit. The ECC code may not fix the failure in this case, and may not even detect the error.

The ECC code may also be generated in the 10-bit domain—after 8b10b conversion of the cell. But when the ECC code is generated from 10-bit characters, many different ECC codes may be produced, but most of them will violate the 10-bit data stream encoding rules, e.g., DC balance is not maintained or the ECC code mimics special control characters defined for the 10-bit domain.

Accordingly, a system or method that can produce a reliable error correction mechanism while maintaining DC balance and permitting clock recovery in the signal transmitted is desirable.

SUMMARY

An embodiment of a method and system is disclosed that provides a reliable ECC code that is transmitted as part of a serial stream. In some embodiments the ECC code is designed to be part of a serial stream that maintains DC balance and allow clock recovery. To provide such an ECC code, in one embodiment, a base ECC code is first generated from the 10-bit cell body. The base ECC code is divided into smaller portions that are each converted to the 10-bit domain in such a manner as to provide DC balance and allows clock recovery when transmitted with the cell body. Hence, the ECC code is represented by an expanded number of bits in one embodiment. Further, the integrity of the ECC code can be checked to determine if there is an error in the transmitted ECC code itself. In one embodiment the integrity of the ECC code is checked by checking the parity of the transmitted ECC code.

More specifically, in an embodiment where an ECC code is generated, the ECC code is divided into smaller portions. Those smaller portions are converted to 8-bit characters. The 8-bit characters are converted to 10-bit characters of a selected parity in a manner that provides DC balance to the overall transmitted data stream. When received, the parity of the 10-bit characters is checked. If the parity does not match the selected parity, an error in the ECC code is indicated. If the parity does match, then the ECC code is used to verify the integrity of and repair errors in the rest of the data cell covered by the ECC code. Subsequently, the data can be converted back to the 8-bit domain.

In this manner, ECC codes can be utilized in the serial 10-bit domain with data cells that undergo 8b10b conversion while maintaining DC balance and having sufficient 0-1 and 1-0 transitions to allow clock recovery.

BRIEF DESCRIPTION OF THE DRAWINGS

The present invention is described with respect to particular exemplary embodiments thereof and reference is accordingly made to the drawings in which:

FIG. 3 is a generalized block diagram of a 12-bit ECC code;

FIG. 4 is a generalized block diagram illustrating the 12-bit ECC code of FIG. 3 divided into portions in accordance with an embodiment of the invention.

FIG. 5 is a generalized block diagram partially illustrating the 8-bit characters resulting from 6b8b conversion in accordance with an embodiment of the invention;

DETAILED DESCRIPTION

Figure 1:
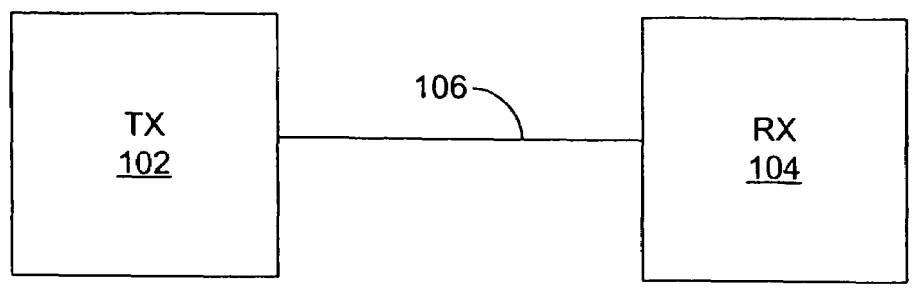
FIG. 1 is a generalized block diagram of a system in accordance with an embodiment of the invention.

Referring to FIG. 1, a system in accordance with an embodiment of the invention includes a transmitting entity 102, a receiving entity 104, and a serial communication link 106 between the entities 102 and 104. In one embodiment, entities 102 and 104 are circuit boards while in other embodiments they could be integrated circuits, or other devices. In some embodiments, communication link 106 is formed with optical fiber, while in other embodiments such a link 106 is formed with electrical conductors, and in still other embodiments, link 106 can be wireless. Although entity 102 is designated in FIG. 1 as a transmitting entity and entity 104 as a receiving entity, it is to be understood that these designations are for clarity of discussion only and that the roles taken on by each can be either transmitting, receiving, or both at a particular time.

The system described with respect to FIG. 1 is very general as the details are not required to form an understanding of the present invention. A more detailed example of a system that can utilize an embodiment of the invention can be found in "Multiservice Switching System with Distributed Switch Fabric," Lau et al., Ser. No. 09/847,711 filed concurrently herewith and subsequently issued as U.S. Pat. No. 7,079,485 on Jul. 18, 2006.

Figure 2:
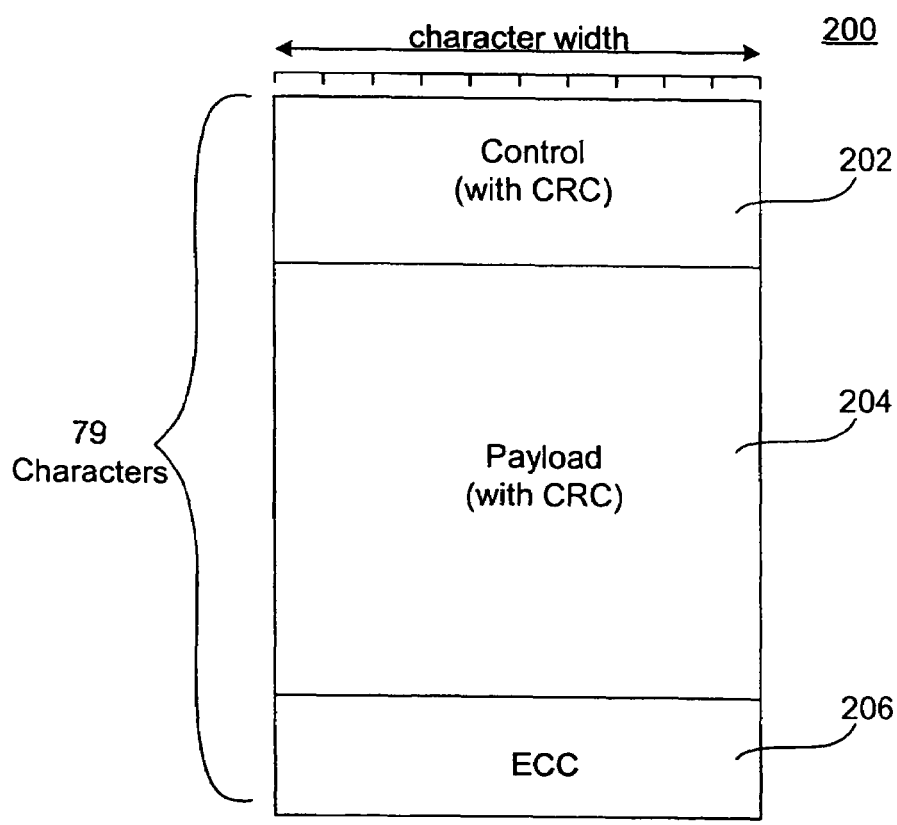
FIG. 2 is a generalized block diagram of a cell.

In a system that utilizes an embodiment of the invention, information is communicated over link 106 using a cell 200, such as that shown in FIG. 2. Cell 200 includes a control field 202, a payload field 204, and an ECC field 206. The control field 202 may include in some embodiments, various fields such as a request/grant field, a source field, a destination field, or a time stamp. The payload field 204 includes the actual data to be transported. It should be understood that the data being transported may incorporate a packet or cell that is formed in accordance with another protocol (e.g., ATM, IP) and may actually have a control portion and data portion within it. In some embodiments, the control field 202 and payload field 204 also include a respective CRC (checksum). For ease of reference, fields other than the ECC field are sometimes referred to generically herein as the "cell body" or the "body." Nonetheless, although the cell body includes the control field and the payload field in one embodiment, in other embodiments it may include more, fewer, and/or different fields.

Data cell 200 can be any size, but in some embodiments is 79 characters, while in some other embodiments it is 69 characters. Moreover, different embodiments may have different fields and/or different size fields. Further, in one embodiment the data cell 200 is composed of characters that are 10-bits in width, although other embodiments are not so limited. Hence, the cell in FIG. 2 is exemplary only.

Prior to transmission and before the ECC code 206 is appended, the information to be sent in the cell body is, in one embodiment, represented by 8-bit characters. These 8-bit characters are converted to the 10-bit domain as is understood in the art such as by following the method described in U.S. Pat. No. 4,486,739 or U.S. Pat. No. 5,025,256. As a result, the data stream for the cell body is DC balanced and allows for clock recovery.

To generate the ECC code to be transmitted in field 206, referring to FIG. 3, a "base" ECC code 302 is first generated, which is 11 or 12 bits in one embodiment. Although such a base ECC code can be generated in a myriad of ways, as will be understood by those of skill in the art, in one embodiment such a base ECC code 302 is generated as follows.

To form bits 3:0 of the base ECC code, selected bits of each 10-bit character of the cell body to be covered by the ECC code are XORed together. The results of those XOR transactions are also XORed. Accordingly, all of the selected bits from each 10-bit character covered by the ECC code are effectively XORed to achieve a particular bit (3:0) of the ECC code. The selected bits to be XORed are described in Table 1, where the "^" symbol represents the XOR operator:

TABLE 1

| ECC Code bit | XORed bits of each character |
| --- | --- |
| [0] | [0] ^ [2] ^ [4] ^ [6] ^ [8] |
| [1] | [1] ^ [2] ^ [5] ^ [6] ^ [9] |
| [2] | [3] ^ [4] ^ [5] ^ [6] |
| [3] | [7] ^ [8] ^ [9] |

As shown in Table 1, bit [0] of the base ECC code is formed by XORing bits 0, 2, 4, 6, and 8 from every 10-bit character in the cell body desired to be covered by the ECC code. In a similar manner, bit [10] of the base ECC code is formed by XORing bits 1, 2, 5, 6, and 9 from every 10-bit character in the cell body desired to be covered by the ECC code. Bit [2] of the base ECC code is formed by XORing bits 3, 4, 5, and 6 from every 10-bit character in the cell body desired to be covered by the ECC code. And [3] of the base ECC code is formed by XORing bits 7, 8, and 9 from every 10-bit character in the cell body desired to be covered by the ECC code.

To form bits [10:4] of the base ECC code, all 10 bits of each 10-bit character desired to be covered by the ECC code are XORed and then those XOR results of selected 10-bit characters are further XORed in accordance with Table 2:

TABLE 2

| ECC Code bit | XORed for cell | 10-bit characters numbered: |
|---|---|---|
| [4] | (1) character every (2) characters starting with character (0) | 0, 2, 4, 6, 8, 10, 12, 14, 16, . . . , 72, 74, 76 |
| [5] | (2) characters every (4) characters starting with character (1) | 1-2, 5-6, 9-10, 13-14, 17-18, . . . , 69-70, 73-74 |
| [6] | (4) characters every (8) characters starting with character (3) | 3-6, 11-14, 19-22, 27-30, 35-38, 43-46, 51-54, 59-62, 67-70, 75-76 |
| [7] | (8) characters every (16) characters starting with character (7) | 7-14, 23-30, 39-46, 55-62, 71-76 |
| [8] | (16) characters every (32) characters starting with character (15) | 15-30, 47-62 |
| [9] | (32) characters every (64) characters starting with character (31) | 31-62 |
| [10] | (64) characters every (128) characters starting with character (63) | 63-76 |

Hence, for base ECC code bit [4], all of the bits in every even 10-bit character of the cell body to be covered by the ECC code are XORed. Note that Table 2 assumes an embodiment of the invention that uses a cell of 79 characters, where 2 of the characters will represent the ECC code.

As described, the base ECC code has two sections: bits[10:4] correlate to the characters of the cell body while bits[3:0] correlate to the bits within the characters. For reasons that will become more apparent later in this disclosure, although the first character or bit in a series of characters or bits is conventionally identified as the character 0 or bit 0, in accordance with one embodiment, the first character or bit are instead identified as character 1 or bit 1 in the base ECC code. Thus, all the characters or bits are identified by a number that is one greater than that conventionally used.

Figure 6:
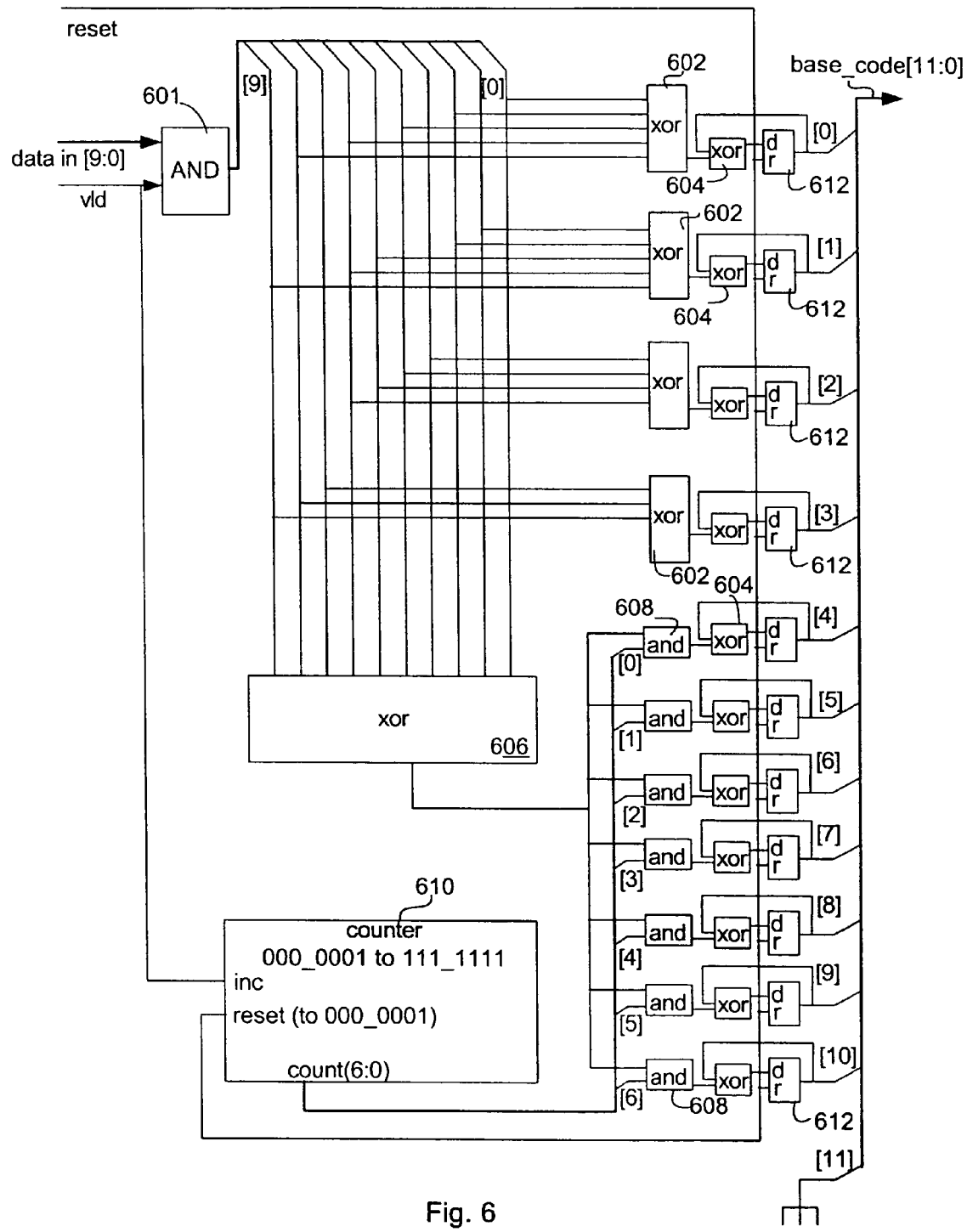
FIG. 6 is a function block diagram of a 12-bit ECC base code generator in accordance with an embodiment of the invention.

A block diagram of a base ECC code generator is shown in FIG. 6. Note in FIG. 6 that Table 2 translates to a counter 610. It should be further noted in FIG. 6 that a base ECC code generated in one embodiment is done in pipelined fashion. In other words, the cell body does not need to be stored while the ECC code is calculated. Instead, a first 10-bit character is placed in the generator and the appropriate bits XORed in accordance with Tables 1 and 2. Then the first character can be transmitted while the next character is input.

More specifically, a 10-bit character (data in [9:0]) is input to the generator along with an indication of whether the data being input is valid (vld) at AND gate 601. XOR gates 602 XOR the appropriate bits of the input character in accordance with Table 1. The output of each respective XOR gate 602 forms the first input to the respective XOR gates 604. The 10-bit character is also input to XOR Date 606, which XORs all the bits for the character. the result of which is the first input to each AND gate 608. The second input to each AND gate 608 is received from counter 610. Accordingly, the AND gates will only pass its first input (from XOR 606) to its output in accordance with Table 2. It should be further noted that the counter 610 initially counts from 000_0001, since the first character is identified as character 1 instead of character 0. The output of the AND gate is the first input to respective XOR gates 604. The second input to each XOR gate 604 is from a respective flip-flop 612. The flip-flop holds the resulting value passed from the respective XOR gate 604 so that it can be XORed with the results generated by the input of the next 10-bit character, and so on. Once all the 10-bit characters for the cell body have passed through the generator of FIG. 6, then the base ECC code has been essentially formed. Nonetheless, in one embodiment, the 11-bit code is transformed into a 12-bit code 306 by adding a zero as the most significant bit (MSB) 304, as shown in FIG. 3. Accordingly, the base ECC code is shown in FIG. 6 as base_code [11:0]. Still other embodiments may generate a base code of a different size and may do so with or without the padded MSB.

The 12-bit base ECC code 306 is next subdivided into two 6-bit characters, A and B, shown in FIG. 4. Each 6-bit character is then converted into an 8-bit character ("6b8b conversion"). Nonetheless, the 6b8b conversion results in only a subset of 8-bit characters from the set of all possible 8-bit characters. The 8-bit characters in the subset of 8-bit characters all share at least one quality in one embodiment: when the 8-bit characters are later converted into a 10-bit character using the 8b10b technique described in U.S. Pat. No. 4,486, 739, the resulting 10-bit character will have even parity (an even number of ones). (Other embodiments may use 8-bit characters that ultimately result in a 10-bit character having odd parity instead of even.). Further, the resulting 10-bit characters will not be illegal characters or special characters (unless such characters are intended).

To achieve the 6b8b conversion of one embodiment (that results in 10-bit characters with even parity), for each 6-bit character, the three MSBs are put into the three MSBs of the new 8-bit characters C and D as shown in FIG. 5. Hence the values of bits 11, 10, and 9 in character A become the values of bits 15, 14, and 13 in character C. Likewise, the values of bits 5, 4, and 3 in character B become the values of bits 7, 6, and 5 in character D.

The three least significant bits (LSBs) of character A are converted to the least significant 5 bits in 8-bit character C as follows. If the three MSBs of character A are equal to 0 (000), then X=1. Otherwise X=0. The five LSBs of C are filled in accordance with Table 3:

TABLE 3

| Bits 8:6 of 6-bit character A | Bits 12:8 in the 8-bit character C |
|---|---|
| 000 | 0001, X |
| 001 | 0010, X |
| 010 | 0100, X |
| 011 | 0111, !X |
| 100 | 1000, X |
| 101 | 1011, !X |
| 110 | 1100, X |
| 111 | 1110, !X |

An exclamation point preceding the value X indicates that the value should take on the opposite polarity of X, e.g., if X=1, then !X=0. In an example conversion, if character A is 0111101, then character C is 01110111.

8-bit character D is converted in a similar manner. If the 3 MSBs equal 0 (000), 4 (100), or 7 (111), then Y=1. Otherwise Y=0. Table 4 is used to fill in the remaining 5 LSBs of D:

TABLE 4

| Bits 2:0 of 6-bit character B | Bits 4:0 in the 8-bit character D |
|---|---|
| 000 | 0001, Y |
| 001 | 0010, Y |
| 010 | 0100, Y |
| 011 | 0111, !Y |
| 100 | 1000, Y |
| 101 | 1011, !Y |
| 110 | 1100, Y |
| 111 | 1110, !Y |

Note that the only difference in the conversion from B to D (Table 4) and the conversion from A to C (Table 3) is that the 3 MSBs of character A can never equal 4 or 7 since the MSB is always 0 in one embodiment. Thus, Tables 3 and 4 are essentially the same and the logic used for the 6b8b conversion from B to D can also be used for the 6b8b conversion from A to C.

The resulting 8-bit characters are converted into 10-bit characters using the same 8b10b conversion as is used for the cell body and as is known in the art, such as that of U.S. Pat. Nos. 4,486,739 or 5,025,256. Because of the specific 8-bit characters built, conversion to 10-bit characters from the resulting 8-bit characters results in 10-bit characters that always have even parity. Thus, a 1-bit error in the 10-bit ECC code characters will result in odd parity. However, other embodiments could be designed so that the resulting 10-bit characters will always have odd parity (so that a 1-bit error in the ECC code characters results in even parity) or even mixed parity (e.g., one of the ECC code characters has even parity and one has odd parity). Nonetheless, for the clarity of the rest of this description, even parity is assumed to be selected. The 10-bit characters with even parity are appended to the 10-bit cell body as ECC field 206.

The above-described conversion of the ECC code to 10-bit characters with a selected parity can be performed simultaneously with or subsequent to the conversion of the cell body to 10-bit characters. For instance, in the embodiment described above, the ECC code conversion occurs after the cell body has been converted into the 10-bit domain, allowing use of the base ECC code generator of FIG. 6.

When converted to 10-bit characters, the cell 200 can be transmitted. Of course, as described with respect to FIG. 6, such a transmission can be in a pipelined fashion. That is, once each character of the information for the cell body undergoes 8b10b conversion and the respective 10-bit character has been applied to the ECC code generator of, for example, FIG. 6, the 10-bit character can be transmitted and does not need to be stored.

Figure 7:
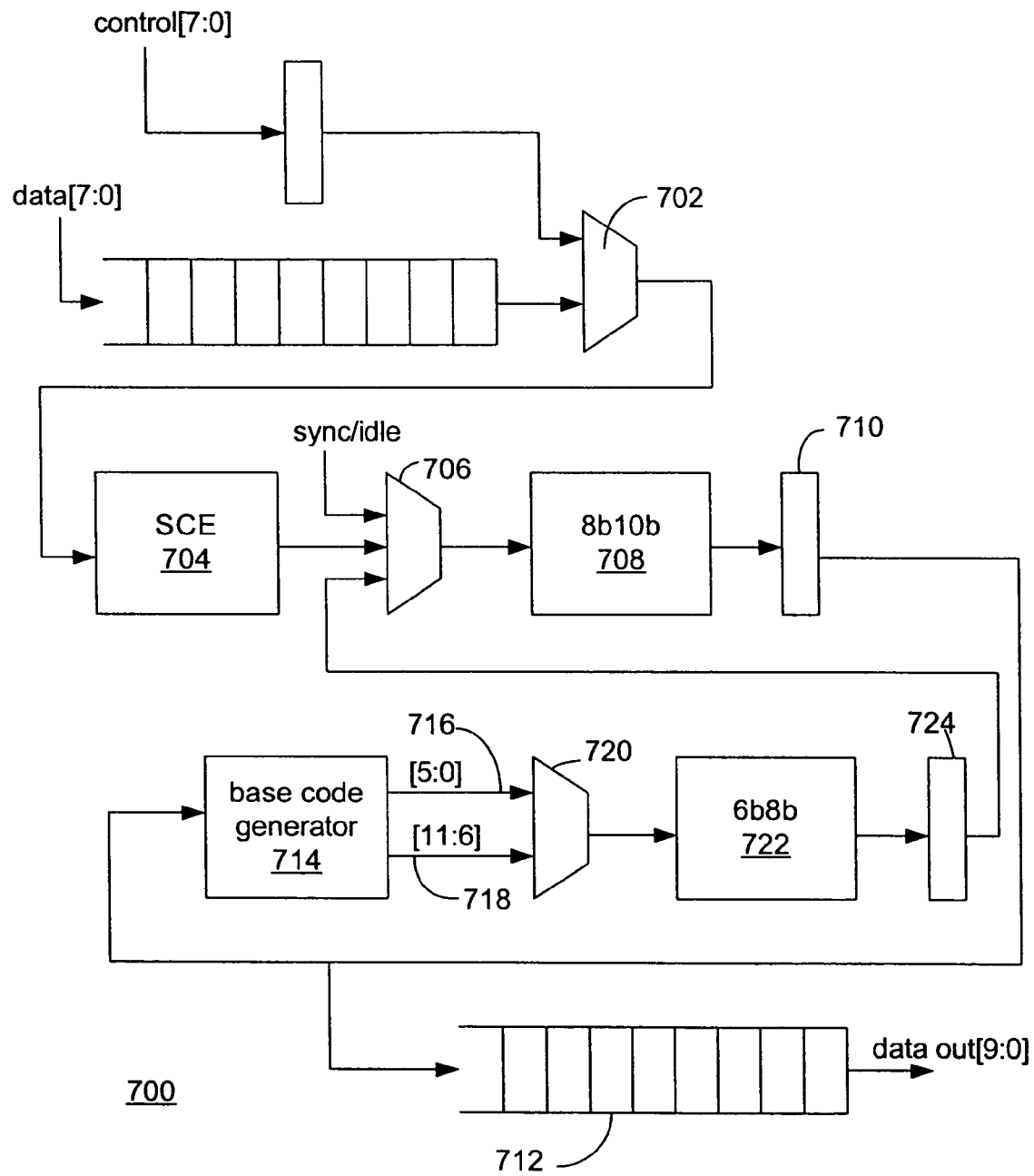
FIG. 7 is a function block diagram of a transmitting system in accordance with an embodiment of the invention.

A specific embodiment in accordance with the invention will now be described with respect to FIG. 7. The 8-bit information for the cell body (data [7:0]) is input into transmit system 700 through multiplexer 702. The output of multiplexer 702 is provided in some embodiments, to Serial CRC Engine (SCE) 704, which appends a CRC code to the 8 bit information as will be understood by those of skill in the art. The output of SCE 704 forms one input to multiplexer 706. A second input to mux 706 is a sync/idle signal. When selected by mux 706, the 8-bit information for the cell body is communicated to 8b10b converter 708. 8b10b converter 708 converts the 8-bit characters to 10-bit characters in one embodiment in accordance with the techniques described in U.S. Pat. Nos. 4,486,739 or 5,025,256.

Once converted to 10-bit characters, the 10-bit cell body characters are communicated to register 710. The 10-bit cell body characters are then communicated (1) to output FIFO 712 to be transmitted and (2) to base code generator 714. Base code generator 714 in one embodiment includes the base code generator of FIG. 6. After all of the data to be covered by the ECC code has been communicated to the base code generator 714, the base code generator completes generation of the base ECC code as described previously.

Base code generator 714 has two outputs 716 and 718, where output 716 carries the low order bits of the base ECC code (bits 5:0) and output 718 carries the high order bits of the base ECC code (bits 11:6). The outputs 716 and 718 form the respective inputs to mux 720. The output of mux 720 is communicated to 6b8b converter 722. Accordingly, 6b8b converter performs the conversion for both the low order and high order bits of the base ECC code in a serial fashion. The output of 6b8b converter 722 is communicated to register 724, which is provided in one embodiment to control timing. Each of the 8-bit characters representing the ECC code are then passed, serially, to the third input of mux 706. When the third input of mux 706 is selected, the 8-bit characters that represent the ECC code are communicated to 8b10b converter 708. The resulting 10-bit characters representing the ECC code are communicated to register 710 and finally to FIFO 712, from which they will be serially transmitted. The use of 8b10b converter 708 for conversion of both the 8-bit cell body characters and the 8-bit ECC characters is particularly beneficial when chip real estate considerations for circuitry placed on an integrated circuit come into play.

In some embodiments of the invention the ECC code does not cover the entire cell body. Instead, it covers only the payload portion 204 of the cell. The control portion 202 of the cell has its own CRC (check sum) code, which can detect many errors. For instance, in one embodiment where the control portion includes a request/grant field, a time-out mechanism will indicate to the sender/requester that no reply will be forthcoming. The receiver can use this time-out mechanism, and not send a response/grant if it finds a bad CRC in the request/grant field. The sending entity, after the time-out, will then resend the data. Alternatively, if a grant is received, but the CRC is corrupt in the control portion, then the receiver of the grant can assume that no grant actually occurred and resend the request. In either case, the request can be made again without jeopardizing the communication. Accordingly, since a recovery mechanism is already in place for this portion of the cell, an ECC code covering this portion of the cell is not necessary. Thus, the size of the ECC code can be reduced by not covering the entire cell with it and latency can be reduced as well, since, during decode (as described below), the entire cell does not have to be held up while the ECC code is verified and a syndrome generated. So as shown in FIG. 7, the control information is treated differently in transmit system 700. As shown, the control information is distinguished by placing it in a separate register or FIFO and then selected by mux 702. Once the control information is converted to the 10-bit domain the control information is passed (through register 710) to the output FIFO 712 and the base code generator 714 will not operate on it.

When the receiving device receives the transmitted cell, the receiving device will analyze the ECC field, compute a syndrome, correct errors in the 10-bit cell body, and convert the cell back from the (possibly corrected) 10-bit characters to 8-bit characters (10b8b conversion). In one embodiment, when the 10-bit data cell is received, if the 10-bit ECC code has an error in it, it will be indicated by odd parity. If odd parity is present in any 10-bit character of the transmitted ECC code, the rest of the cell will be defined as good: since the ECC is only designed in one embodiment of the invention to protect against 1-bit failures, the presence of the 1-bit failure on the ECC implies the cell body is considered uncorrupt, given the underlying assumption of a maximum of a 1-bit failure per cell transferred. If the parity for any 10-bit character of the transmitted ECC code is even, then a syndrome is generated, as will be described more fully below. The syndrome is used to determine where in the data an error occurred, if any. Once identified, the error can be repaired while in the 10-bit domain. The data then undergoes conversion back to the 8-bit domain.

Figure 8:
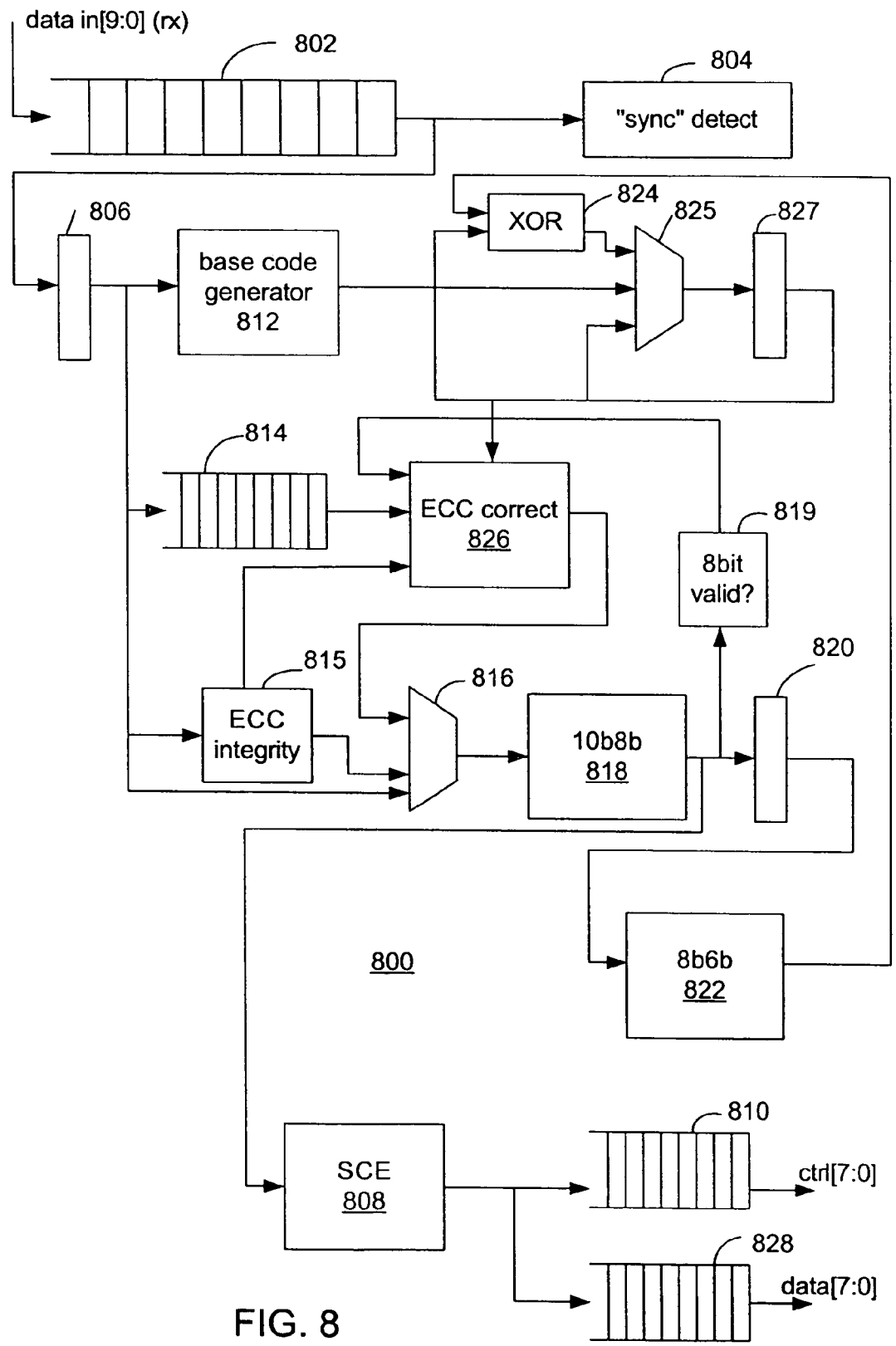
FIG. 8 is a function block diagram of a receiving system in accordance with an embodiment of the invention.

More specifically, FIG. 8 shows a receiving system 800 in accordance with an embodiment of the invention. The received cell is first stored in a receiving FIFO 802. A "sync" detection mechanism 804 is used to detect transmitted "sync" characters and enables the system to determine the start of the cell, as will be understood in the art. The cell characters are communicated to register 806. In an embodiment where the control information is not covered by the ECC code, such as that described with respect to FIG. 7, the control information is communicated to SCE 808 (through mux 816 and 10b8b converter 818), which checks the CRC checksum for the control information, and then to output FIFO 810.

All characters that are covered by the ECC code are communicated to two places: base code generator 812 and FIFO 814, which holds the characters until a syndrome is generated (as described below).

Base code generator generates an expected base ECC code based on the 10-bit data received in the transmitted cell. The base code generator 812 will generate the expected base ECC code in a manner similar to that done by the transmit system, e.g., using the system shown in FIG. 6.

In the meantime the transmitted 10-bit characters that represent the ECC code are communicated to ECC code integrity checker 815. Integrity checker 815 in one embodiment verifies if the parity on each character of the ECC code is correct. The 10-bit characters that represent the ECC code are communicated to mux 816 and then to 10b8b converter 818. 10b8b converter 818 converts the 10-bit characters back to 8-bit characters in accordance with U.S. Pat. No. 4,486,739, in one embodiment, or U.S. Pat. No. 5,025,256 in another embodiment. The 8-bit converted characters are communicated to register 820 and then to 8b6b converter 822. 8b6b converter 822 converts the 8-bit characters back to 6-bit characters in a manner that is the opposite function of that described with respect to the 6b8b conversion previously.

Once the transmitted-ECC code has been converted back to two 6-bit characters, in one embodiment, then a comparison between the actual transmitted ECC code and the newly generated expected ECC code is made using XOR logic 824. The two codes are bitwise XORed, resulting in a generated syndrome (every compared bit that does not match will generate a logical "1" and every match will generate a logical "0"). The ECC syndrome indicates, when non-zero, what bit in the data must be flipped to correct a single-bit error. If the ECC syndrome is zero, no error has been detected, and the data will be read from the ECC FIFO without any correction. But if the ECC syndrome is non-zero, correction will be attempted. In either case the syndrome is provided to the ECC correction unit 826 (through mux 825 and register 827).

Much like the ECC code, the ECC syndrome has two sections: bits [10:4] of the syndrome indicate which character has the error while bits [3:0] indicate which bit in the specific character has the error. Note that correction is performed on the cell body in the 10-bit domain before conversion to the 8-bit domain.

The character to be corrected is determined by subtracting one (binary 000_0001) from the syndrome bits [10:4]. Because a zero syndrome indicates no error, if an error were to occur in character [0], then a conflict would occur. So when it is formed, the base ECC code identifies each character with a number that is one greater than that conventionally used. As a result, the syndrome also identifies the erroneous character plus one. If the character to be corrected does not exist (e.g., it is identified by a number that is greater than the number of characters present), then more than one bit is assumed to be in error. In such a case, in one embodiment, no correction is made and an error is flagged.

The bit to be corrected is determined by subtracting one (binary 0001) from the syndrome bits [3:0], for the same reasons as the subtraction occurs for the character identification. If the bit to be corrected does not exist (e.g., it is identified by a number that is greater than 9), more than one bit is assumed to be in error. In such a case, in one embodiment, no correction is made and an error is flagged.

When no correction is to take place because the syndrome indicates invalid character or bit numbers, because the parity is incorrect as identified by checker 815, or because 10b8b conversion (818) resulted in invalid 8-bit characters (validity checker 819), then ECC correction unit 826 simply passes the characters stored in FIFO 814 through to mux 816 unchanged. But when the character and bit identified are in appropriate ranges and the ECC code integrity and the 8-bit codes are valid, then when the ECC correction unit 826 reads the characters from the FIFO 814, it corrects the appropriate bit in the appropriate character identified by the syndrome by flipping that bit.

The ECC correction unit 826 communicates the 10-bit characters, corrected as appropriate, to mux 816, which in turn communicates the characters to 10b8b converter 818. The converted 8-bit characters are next communicated to SCE unit 808 where any CRC checksums that were appended to the 8-bit data are checked. In some embodiments, the CRC checksums can be used to detect errors that were not detected by the ECC code (e.g., multibit errors). The 8-bit data is then placed in a FIFO 828 to be available for use by other systems.

As shown in FIG. 8, the control data and the payload data are treated separately and even placed in separate FIFOs 810 and 828. Nonetheless, other embodiments may not distinguish the two and FIFOs 810 and 828 may be one and the same.

Figure 9:
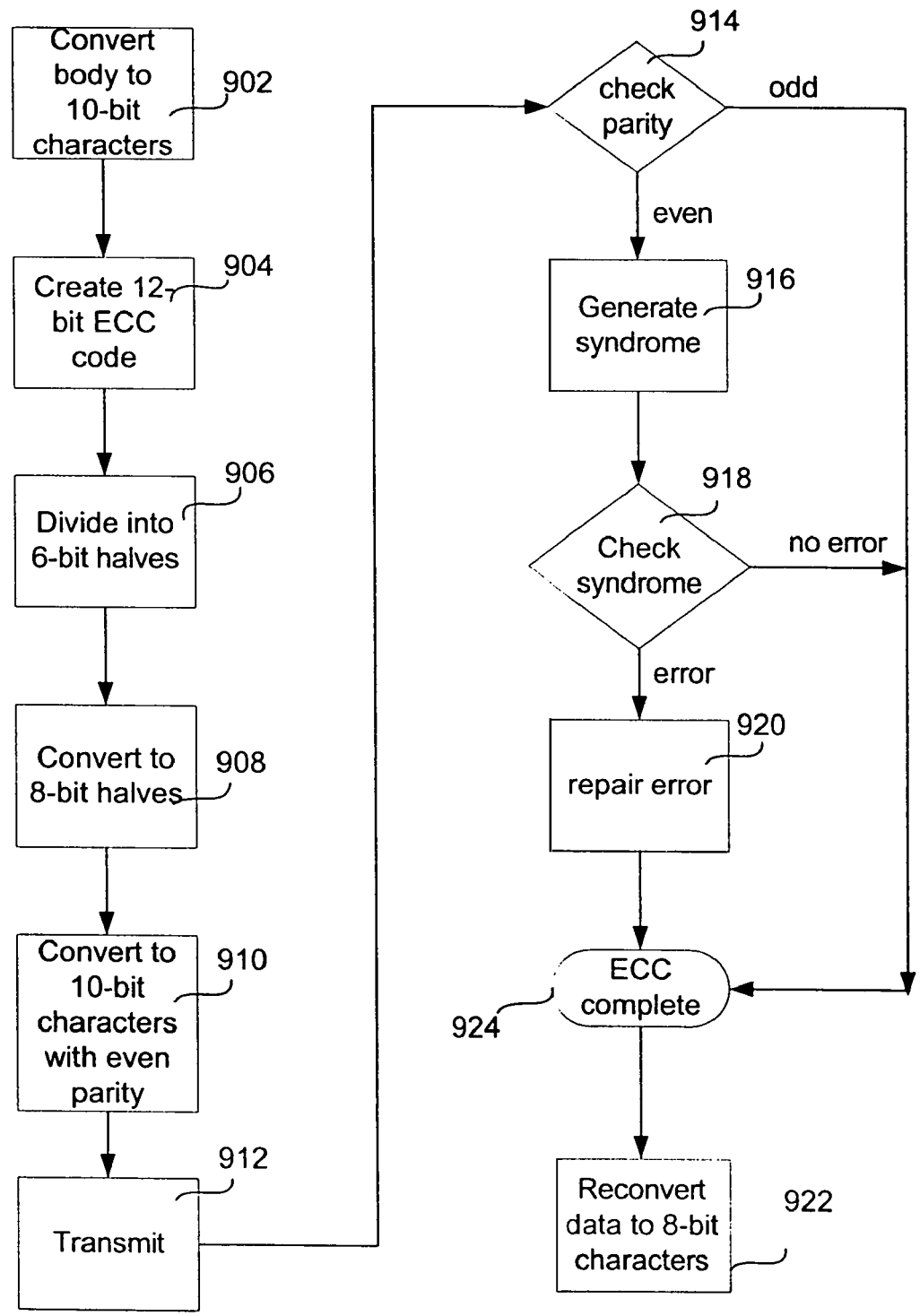
FIG. 9 is a flow diagram illustrating steps taken in accordance with an embodiment of the invention.

In sum, referring to FIG. 9, the following steps are performed. First, the cell body is converted to the 10-bit domain, step 902, in one embodiment. A base ECC code is generated, step 904, which in one embodiment is 12-bits. Other embodiments may generate a base ECC code of a different size. The 12-bit base code is divided into two 6-bit halves, step 906. Each 6-bit half is then converted into an 8-bit half that when converted into a 10-bit character will have even parity, step 908. Each 8 bit half is converted into a 10-bit character, step 910. The cell as converted to 10-bit characters including the 10-bit ECC code, is transmitted, step 912.

The receiving entity verifies the integrity of the 10-bit ECC characters as received, and does so in one embodiment by checking the parity of each of the ECC code characters, step 914. If the parity in any ECC code character is odd, an error has been found in the ECC code itself and the body is defined as good, step 924. But if the parity is even, then a syndrome is utilized for error checking and correction. The syndrome is generated, step 916, by comparing a newly generated expected base ECC code with the base ECC code actually transmitted (as obtained by converting the 10-bit characters back to 8-bits and then 6-bits, respectively). The syndrome is then analyzed to determine if an error in the data exists, step 918. If the syndrome indicates no errors, the data is defined as good and use of the ECC code is complete, step 924. But if the syndrome indicates an error, the error is repaired, step 920. After repair, the data is defined as good and use of the ECC code is complete. Further, even if no repair was attempted (e.g., a multibit error was detected), use of the ECC code may still be complete. Once use of the ECC code is complete, then the data can be reconverted to the 8-bit domain, as is understood in the art, for instance, in accordance with U.S. Pat. Nos. 4,486,739 or 5,025,256.

As shown in FIG. 8, in some embodiments, even if the data is found to be good at step 914, a syndrome is still generated and steps 916-918 are performed. Step 920 is inhibited if there are no errors, e.g., by use of a logic gate. In this manner, the process can be simplified and hardware minimized.

6b8b10b conversion was selected in one embodiment of the invention for the ECC code because of the ease of translation from 8-bits to 10-bits, since readily known tables can be easily used and since 8b10b conversion is already used for the cell body. Nonetheless, other embodiments may start with an ECC code of a different size than 11or 12 bits. Further, the ECC code is not required to be split into 6-bit halves: in other embodiments, for example, the ECC code could be divided into 5-bit portions, or could be divided into thirds or not divided at all. Other than ease of translation, there is no reason why the divided ECC needs to be split into equal halves, thirds or other portions, and therefore, some embodiments may divide the ECC code into unequal portions.

For instance, in another embodiment of the invention a 14-bit ECC code can be generated to protect against all single bit failures of a 640-bit data cell. The 14-bit code can be divided into two 7-bit characters and then converted to 10-bit characters prior to transmission. In one embodiment, the 7b10b encoding results in two 10-bit characters having even parity. So, if there is a one-bit failure during transmission, and if that failure occurs in a data bit, the 10-bit ECC code can be used to correct the data before it is converted to the 8-bit domain from 10-bits. But if the failure occurs on an ECC bit, the 10-bit ECC code character will have odd parity. Accordingly, any 10-bit character that has odd parity in the 10-bit domain is discarded and no data correction is performed, so that the cell is defined as good, again assuming a maximum of one 1-bit error in a data cell.

Other embodiments could implement the invention using not only different character sizes but also using a check that is different from a parity check to verify the integrity of the ECC characters. For instance, in one embodiment the base ECC code can be formed into characters that are 8-bit characters similar to that described previously. Rather than selecting a subset of 8-bit characters, however, each character is converted to 10-bit characters and then sent twice. Other embodiments may send the original 10-bit character and then a correlated character (e.g., the complement of the original character). If the corresponding characters as received do not match (or are uncorrelated), an error in the ECC code is indicated. In another embodiment a similar check can be made using bits, e.g., each bit is sent twice so that if each pair of received bits are not identical an error is indicated.

In still another embodiment a CRC checksum can be used over the ECC code. In such an embodiment once the base ECC code was converted to 8-bit characters, an additional n-bit CRC code could be appended and used to check the ECC. Morever, in such an embodiment where a 5-bit CRC code is generated (n=5), and where an 11-bit base ECC code is generated, the total of 16 bits can be divided into two 8-bit halves and then converted to 10-bit characters for transmission.

Although various embodiments of the invention have been described with respect to the 10-bit domain, nothing herein limits it to the 10-bit domain. Accordingly, some may find embodiments of the invention useful for transmitting data having characters larger or smaller than 10bits.

Although only embodiments have been described that have cells with one ECC field, some embodiments of the invention may have cells that include multiple ECC fields.

Finally, one embodiment of the invention is designed to be implemented entirely in hardware. Nonetheless, other embodiments could be fully or partially implemented in hardware, software, or firmware.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A method of preparing to transmit a data cell having a cell body, where the transmission is to include transmitting the data cell though a link prone to transmission errors, said method comprising:

(a) forming a first representation of an ECC code for at least a portion of the cell body, wherein said at least a portion of the cell body is pre-configured for transmission though the link and wherein the first representation includes a first number of bits; and (b) converting the first representation of the ECC code to a second representation, wherein the second representation includes a second number of bits greater than the first number of bits; and (c) converting the second representation into a third representation configured for transmission though the link.

2. The method of claim 1, wherein the link is an asynchronous serial link and wherein the third representation of the ECC code is configured to be part of a transmitted serial stream that allows for clock recovery from the transmitted serial stream.

3. The method of claim 1, wherein the third representation of the ECC code is configured to be part of a transmitted serial stream that is DC balanced.

4. The method of claim 1, wherein the link is an asynchronous serial link, wherein the third representation of the ECC code is adapted to be part of a transmitted serial stream that allows for clock recovery from the transmitted serial stream and wherein the third representation of the ECC code is further adapted to be part of a transmitted serial stream that is DC balanced.

5. A method of generating a combination of body data and an error checking-or-correcting code for checking and/or correcting a transmitted version of the body data, where the generated combination of body data and error checking-or-correcting code can be transmitted through a link prone to transmission errors, the generating method comprising:
 (a) first converting the body data into transmittable body data that is configured for transmission through the link;
 (b) creating first error checking-or-correcting code capable of checking and/or correcting the transmittable body data;
 (c) splitting the first error checking-or-correcting code into at least first and second base code portions;
 (d) mapping at least one of the at least first and second base code portions into a respective lengthened code, each respective lengthened code having a greater number of bits than its respective base code portion; and
 (e) second converting the at least one lengthened code of a respective base code portion and remaining other derivatives of the other base code portions into transmittable checking-correcting data that is configured for transmission through the link.

6. The generating method of claim 5 wherein;
 (e. 1) said second converting includes causing the transmittable checking-correcting data to be self validating.

7. The generating method of claim 5 wherein;
 (a,e. 1) said first and second converting each generate data that is substantially DC balanced.

8. The generating method of claim 5 wherein;
 (a,e. 1) said first and second converting each generate data whose bit sequences provide for clock recovery from the generated bit sequences.

9. The generating method of claim 5 wherein;
 (a,e. 1) said first and second converting each generate data that excludes special bit sequences reserved for special functions of the link.

10. A system for generating a combination of body data and an error checking-or-correcting code for checking and/or correcting a transmitted version of the body data, where the generated combination of body data and error checking-or-correcting code can be transmitted though a link prone to transmission errors, the generating system comprising:
 (a) first converting means for first converting body data into transmittable body data that is configured for transmission though the link;
 (b) first code creating means for creating first error checking-or-correcting code capable of checking and/or correcting the transmittable body data;
 (c) splitting means for splitting the first error checking-or-correcting code into at least first and second base code portions;
 (d) mapping means for mapping at least one of the at least first and second base code portions into a respective lengthened code, each respective lengthened code having a greater number of bits than its respective base code portion; and
 (e) second converting means for causing the at least one lengthened code of a respective base code portion to be converted into transmittable checking-correcting data that is configured for transmission though the link.

11. A system for receiving a combination of body data and error checking-or-correcting data, where the received error checking-or-correcting data is configured for checking and/or correcting the received version of the body data, where the received combination of body data and error checking-or-correcting code might have been transmitted though a link prone to transmission errors, the receiving system comprising:
 (a) de-converting means for de-converting the received error checking-or-correcting data from a form adapted for transmission though the link to a form having a plurality of lengthened code portions where each lengthened code portion maps to a corresponding and shorter base code portion;
 (b) mapping means for mapping at least one of the lengthened code portions to a corresponding and shorter base code portion, where there are at least two different, lengthened code portions that map to a same corresponding, base code portion;
 (c) alternate base code generating means for generating from the received version of the body data, alternate base code portions; and
 (d) comparing means for comparing at least one of the alternate base code portions with a corresponding at least one of the base code portions produced by said mapping means.

12. The receiving system of claim 11 and further comprising:
 (e) error checking and correcting means, coupled to receive the lengthened code portions of the de-converting means and to further receive the received version of the body data, for generating checked and/or corrected body data from the received version of the body data.

13. The receiving system of claim 12 and further comprising:
 (f) de-convert causing means for causing the checked and/or corrected body data to be de-converted from a form adapted for transmission though the link to a shortened form having a fewer number of bits.

14. The receiving system of claim 11 and further comprising:
 (e) integrity validating means for validating the integrity of the received error checking-or-correcting data.

* * * * *